United States Patent [19]
Porat

[11] 3,932,848
[45] Jan. 13, 1976

[54] FEEDBACK CIRCUIT FOR ALLOWING RAPID CHARGING AND DISCHARGING OF A SENSE NODE IN A STATIC MEMORY

[75] Inventor: Eli Porat, Albany, Calif.
[73] Assignee: Intel Corporation, Santa Clara, Calif.
[22] Filed: Jan. 20, 1975
[21] Appl. No.: 542,253

[52] U.S. Cl.... 340/173 R; 340/173 CA; 340/173 SP
[51] Int. Cl.²............................................ G11C 7/06
[58] Field of Search.... 340/173 R, 173 CA, 173 SP; 307/238; 320/1

[56] References Cited
UNITED STATES PATENTS

| | | | |
|---|---|---|---|
| 3,652,914 | 3/1972 | Krausser | 320/1 |
| 3,765,002 | 10/1973 | Basse | 340/173 CA |
| 3,848,236 | 11/1974 | Troutman | 340/173 CA |

*Primary Examiner*—Stuart N. Hecker
*Attorney, Agent, or Firm*—Spensley, Horn & Lubitz

[57] ABSTRACT

A feedback circuit for feeding back a signal to control the charging of a sense node in a static MOS memory. A signal from a sense amplifier is fed back to prevent the node from dropping below a predetermined potential and to prepare the node to be recharged. This in turn allows the pull-up transistor to have a higher resistance allowing the node to be more quickly discharged.

10 Claims, 2 Drawing Figures

FEEDBACK CIRCUIT FOR ALLOWING RAPID CHARGING AND DISCHARGING OF A SENSE NODE IN A STATIC MEMORY

BACKGROUND OF THE INVENTION

1. Field of the Invention

The invention relates to the field of sensing circuits in memories, particularly in MOS static memories.

2. Prior Art

In static metal-oxide-silicon (MOS) memories a sensing node which is selectively coupled to column lines in the array is charged through a pull-up transistor. When the column lines in the array are coupled to a selected cell the charge on the sensing node may discharge depending upon the binary state stored in the cell. A sense amplifier coupled to the sense node senses the drop in potential or the discharge of the node if it occurs, thereby producing an output signal representative of the binary state of the cell.

In such prior art circuits it is apparent that if the pull-up transistor has a low conductive resistance, it will charge the sense node more quickly, thereby allowing more frequent reading. However, a low conductive resistance of the pull-up transistor results in slower discharging of the sense node since the pull-up transistor will resist the discharge. During discharge it is desirable then to have a pull-up transistor having a high impedance. In general, a compromise is necessary to obtain both acceptable charging and discharging times.

The problem of selecting a compromise conductive resistance becomes more difficult where a plurality of column lines are coupled to a single sense node or where the memory cells are current limited. The larger capacitance associated with the plurality of memory lines require that the resistance of the pull-up transistor be low to compensate for this added capacitance, whereas the higher impedance, current limited cells, require a higher resistance pull-up transistor to achieve rapid discharge of the sense node.

As will be seen, the present invention provides a feedback circuit which provides an alternate current path for charging the sense node. When the potential on this node drops below a predetermined level the alternate current path prevents the node from further dropping in potential and, moreover, since there is an alternate charging path the pull-up transistor may have a higher impedance.

SUMMARY OF THE INVENTION

An improvement is disclosed for a static memory having a charged sense node which is selectively coupled to memory cells in the memory for sensing the state of the cells in the memory, a charging means for charging the sensing node, and a sense amplifier having its input coupled to the sense node. A control means for controlling the flow of current is coupled to the sensing node. A feedback means coupled between the sense amplifier and the control means controls the flow of current at the node. This allows the node to be both rapidly charged and discharged since the voltage swing at the node is restricted.

DETAILED DESCRIPTION OF THE INVENTION

The present invention provides a control means for controlling the flow of current at a sense node in a static memory. The control means is controlled by a feedback path originating at a sense amplifier. In the presently preferred embodiment, by way of example and not by way of limitation, the feedback path is utilized in a metal-oxide-silicon (MOS) read-only memory (ROM). In one case (FIG. 1) the memory is an 8k ROM, while the other case (FIG. 2) the memory is a 16k ROM. In the presently preferred embodiment all the transistors utilized are n-channel, enhancement mode (unless otherwise stated), field-effect transistors employing polycrystalline silicon gates.

Figure 1:
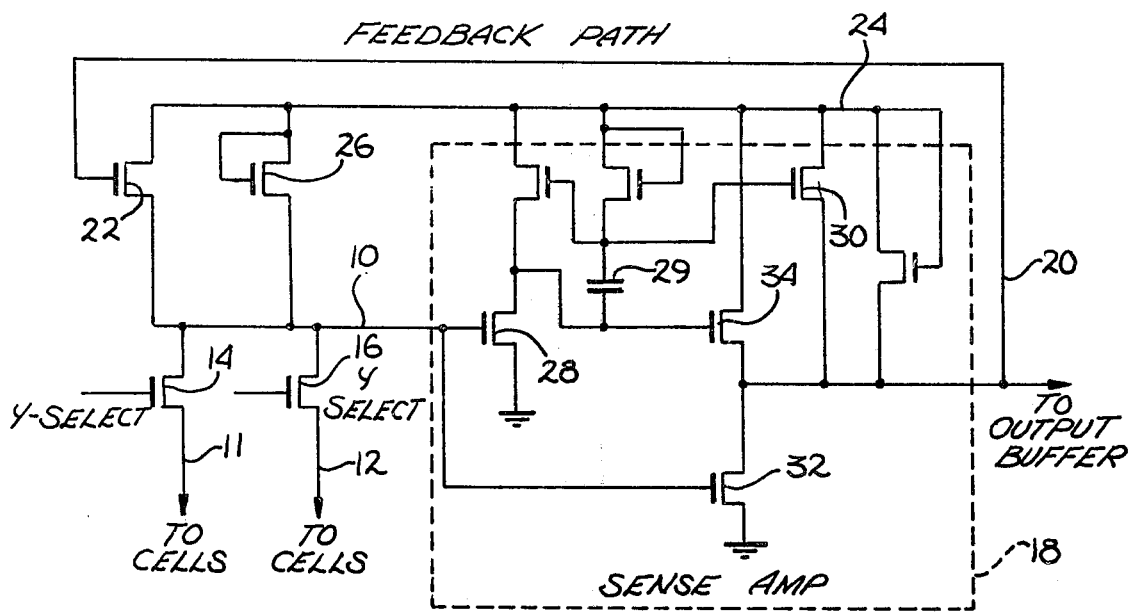
FIG. 1 is a circuit diagram of one embodiment of the invention illustrating a single feedback path.

Referring first to FIG. 1, the sense node or critical node 10 is illustrated coupled to column lines 11 and 12 through Y-select transistors 14 and 16. The column lines 11 and 12 may be directly coupled to cells in a memory array, or may be each selectively coupled to a plurality of column lines in a memory through additional Y-select transistors. As will be appreciated, the number of column lines coupled to the sense node 10 is not critical for the present invention, although the invention becomes more useful where more column lines are coupled to a single sense node. The column lines are selectively coupled to cells (not illustrated) by decoder circuits and as is customary, each cell is also coupled to an X-line in the array, thereby allowing random access of any cell. The particular structure of the cell is not critical to the present invention in any one of a plurality of known cells may be utilized.

The sense node 10 is coupled to a sense amplifier shown within the dotted line 18. The output of sense amplifier, line 20, is fed-back to the gate of the feedback transistor 22. Feedback transistor 22 is coupled between a source of potential, line 24, and the sense node 10. A pull-up transistor, transistor 26, is likewise coupled between line 24 and node 10. The gate of this transistor is coupled to the transistor's drain thereby rendering the transistor continually conductive.

The particular configuration of the sense amplifier is not critical to the present invention. The sense amplifier of FIG. 1 includes input transistors 28 and 32 and output transistors 30 (double bootstrap) and 34 (push-pull). The gate of the output transistor 30 is bootstrapped by the bootstrap capacitor 29 when transistors 28 and 32 cease to conduct. When this occurs it is apparent that line 20 will rise in potential, to the potential applied to line 24. When this occurs transistor 22 conducts thereby providing a flow of current from line 24 to node 10.

In operation assume first that column lines 11 and 12 are not coupled to cells in the memory. Node 10 is charged to the potential of line 24, less the threshold drop of transistor 26, through the pull-up transistor 26. The potential on node 10 causes transistor 32 to conduct, thereby clamping the feedback path, line 20, to ground. Assuming now that a column line is coupled to a cell, and the cell is programmed such that node 10 begins to discharge, the discharging of node 10 will produce an output signal on line 20, thereby causing transistor 22 to conduct. This in turn will prevent node 10 from continuing to discharge. Thus anytime node 10 drops below a predetermined voltage level, such level being sufficient to cause an output signal on line 20, the signal on line 20 prevents node 10 from continuing to drop in potential since transistor 22 conducts.

When the column is deselected (that is, decoupled from node 10) the voltage on node 10 rises. When this rise is sufficient to cause the output on line 20 to drop, transistor 22 ceases to conduct. Since transistor 22 prevented node 10 from dropping below a predetermined potential (as it does in the prior art) the pull-up transistor 26 may rapidly recharge the node even though transistor 26 has a higher resistance than the prior art pull-up transistors. This higher resistance of transistor 26, off course, allows node 10 to quickly discharge. By way of example, the Z/L ratio of the pull-up transistor for a prior art circuit was 6/12. With the addition of the feedback path and transistor 22, the pull-up transistor 26 was reduced to 6/18 with a Z/L ratio of 7/6 for the feedback transistor 22. With the circuit of FIG. 1 typical charging times were decreased by over 50 percent, and discharging times were improved by more than 30 percent.

Figure 2:
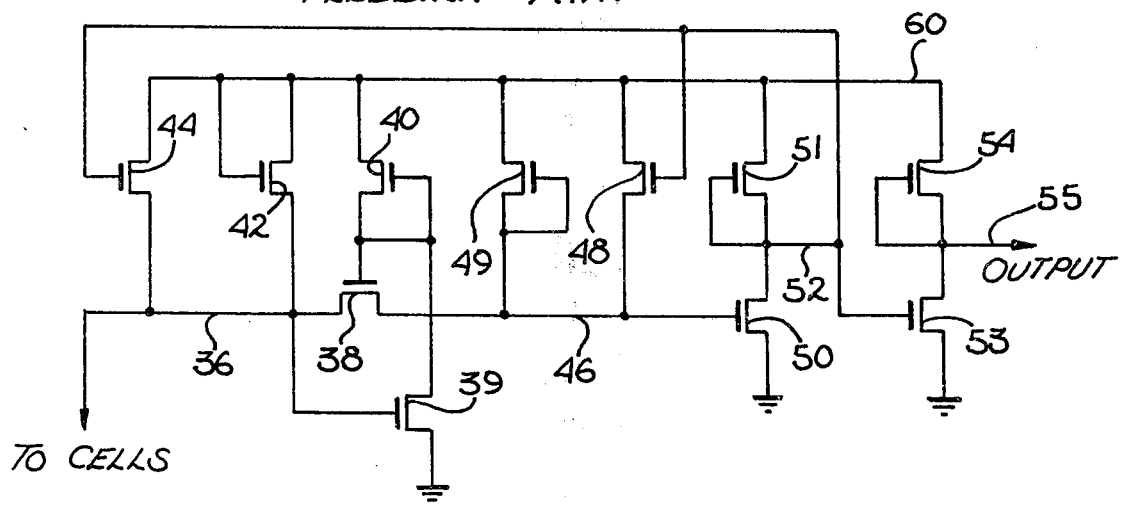
FIG. 2 is a circuit diagram illustrating an alternate embodiment of the present invention wherein two feedback paths are utilized.

Referring to FIG. 2, the sense node 36 in the presently preferred embodiment is coupled to cells in the memory array through a plurality of column select transistors as is commonly done in the art. Node 36 is coupled to the source of potential, line 60, through a pull-up transistor 42 which has its gate coupled to line 60. The node 36 is also coupled to line 60 through the feedback transistor 44. The gate of transistor 44 is coupled to node 52 of a sense amplifier.

The sense amplifier includes a first stage comprising transistors 38, 39 and 40 which is coupled between nodes 36 and 46. In this first stage transistors 39 and 40 are utilized to adjust the threshold level of transistor 38 as is known in the art. Node 46 includes a depletion load pull-up transistor 49 which is coupled between line 60 and node 46, the gate of transistor 49 is coupled to node 46. Also, node 46 includes a feedback transistor 48 which is coupled between line 60 and node 46. The gate of this transistor is coupled to the feedback path, which includes node 52. Node 46 is also common with the gate of transistor 50.

Transistors 50 and 51 comprise a second stage of the sense amplifier and include an output at node 52. The gate of the depletion load transistor 51 is coupled to node 52. The sense amplifier also includes an output stage comprising transistor 53 and the depletion load transistor 54. The common junction between these transistors also includes the gate of transistor 54 and the output line 55. In the presently preferred embodiment feedback transistors 44 and 48 are depletion mode devices.

The depletion load device 49 charges node 46 to the potential of line 60; pull-up transistor, on the other hand, charges node 36 to the potential of line 60, less the threshold drop of transistor 42. Prior to the time that a cell is coupled to node 36, transistor 38 does not conduct since its gate is coupled to ground through transistor 39.

The operation of the feedback system and sense amplifier shown in FIG. 2 is somewhat similar to the operation of the circuit of FIG. 1. When the potential on node 36 drops below a predetermined level transistor 39 ceases to conduct. This causes the potential on the gate of transistor 38 to rise, turning on transistor 38. The potential on node 46 then begins to drop since this node is now coupled to the column line through transistor 38. When the potential on node 46 drops below a predetermined level, transistor 50 turns-off, thereby providing an output signal on node 52. This causes transistors 44 and 48 to conduct thus preventing the potentials on nodes 36 and 46 from continuing to drop in potential, that is their voltage swing is limited. After the column line is decoupled nodes 36 and 46 are recharged, turning on transistor 50, causing node 52 to drop. In actual practice substantial increases in both the charging rate and discharging rate of the nodes have been obtained.

I claim:

1. In a static memory having a charged sense node which is selectively coupled to memory cells in the memory for sensing the state of such cells, a charging means for charging said sense node, and a sense amplifier having its input coupled to said sense node, an improvement comprising:
    control means for controlling the flow of current coupled to said sense node; and
    feedback means coupled between said sense amplifier and said control means for controlling the flow of current at said sense node;
    whereby said sense node may be rapidly charged and discharged since the voltage swing at the node is restricted.

2. The improvement defined by claim 1 wherein said control means includes a field-effect transistor coupled between a source of potential and said sense node and wherein the gate of said field-effect transistor is coupled to said feedback means.

3. The improvement defined by claim 2 wherein said charging means comprises a pull-up transistor coupled between said sense node and said source of potential.

4. The improvement defined in claim 1 wherein said sense amplifier includes a node which is charged through a second charging means and wherein said node is coupled to a source of potential through a feedback transistor having a gate, said gate of said feedback transistor being coupled to said feedback means.

5. The improvement defined by claim 4 wherein said charging means and said second charging means each comprise pull-up transistors.

6. The improvement defined by claim 5 wherein said control means comprises a depletion mode field-effect transistor.

7. An apparatus for sensing potential on a sense node where said sense node is coupled to static memory cells comprising:
    a source of potential;
    a first transistor coupled between said source of potential and said sense node;
    a sense amplifier having its input coupled to said sense node;
    a second transistor having a gate and two terminals, said terminals being coupled between said sense node and said source of potential; and
    a feedback line coupled between said gate of said second transistor and said sense amplifier for feeding back a signal from said sense amplifier;
    whereby when said potential on said sense node drops said second transistor conducts thereby limiting the drop in potential on said sense node.

8. The apparatus defined by claim 7 wherein said first and said second transistors are n-channel, field-effect transistors.

9. The apparatus defined by claim 7 wherein said first transistor includes a gate coupled to said source of potential.

10. The apparatus defined by claim 7 wherein said static memory is a read-only memory.

* * * * *